(12) United States Patent
Bayot

(10) Patent No.: US 6,703,259 B2
(45) Date of Patent: Mar. 9, 2004

(54) SYSTEM AND METHOD FOR ACHIEVING PLANAR ALIGNMENT OF A SUBSTRATE DURING SOLDER BALL MOUNTING FOR USE IN SEMICONDUCTOR FABRICATION

(75) Inventor: Art Bayot, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/242,076

(22) Filed: Sep. 12, 2002

(65) Prior Publication Data

US 2003/0124765 A1 Jul. 3, 2003

Related U.S. Application Data

(60) Provisional application No. 60/343,936, filed on Dec. 28, 2001.

(51) Int. Cl.[7] .......................... H01L 21/44; H01L 21/48; H01L 21/50
(52) U.S. Cl. ........................................................ 438/106
(58) Field of Search .......................... 438/106, 107–108, 438/110–114, 127, 121

(56) References Cited

PUBLICATIONS

"Solder Ball Attachment System" Shafie. U.S. patent Publication No. US2002/0170945 A1 Published Nov. 21, 2002, filed May 17, 2001.*

* cited by examiner

*Primary Examiner*—Craig Thompson
(74) *Attorney, Agent, or Firm*—Michael K. Skrehot; Wade James Brady, III; Frederick J. Telecky, Jr.

(57) ABSTRACT

A system (10) and method (30) for precisely depositing a solder compound onto a substrate (18). The system (10) generally includes a receiving member (20) having a rotatable portion (21) adapted to receive a planar substrate (18), a horizontal member (12) for depositing solder balls (11) on the substrate (18), and a contact member (14), located between the receiving member (20) and horizontal member (12). The contact member comprises an aligner plate (14) having a pair of stoppers (15) protruding therefrom. Advantageously, pivotable portion (21) of the system (10) establishes the planarity of the substrate (18), with respect to the horizontal mount (12) allowing for the solder balls (11) to be mounted thereon, preventing the substrate (18) from being slightly misaligned, warped, and/or tilted.

13 Claims, 3 Drawing Sheets

SYSTEM AND METHOD FOR ACHIEVING PLANAR ALIGNMENT OF A SUBSTRATE DURING SOLDER BALL MOUNTING FOR USE IN SEMICONDUCTOR FABRICATION

CLAIM OF PRIORITY

This application claims priority of U.S. Provisional patent application Ser. No. 60/343,936 filed Dec. 28, 2001 entitled "System and Method for Achieving Planar Alignment of a Substrate During Solder Ball Mounting for Use in Semiconductor Fabrication"

FIELD OF THE INVENTION

The present invention relates generally to semiconductor packaging and assembly and, more particularly, to a method and system for achieving planar alignment of a substrate during solder ball mounting.

BACKGROUND OF THE INVENTION

Improvements in semiconductor packaging and assembly are rapidly being made by semiconductor manufacturers with the overall goal of increasing productivity while reducing material waste. These improvements typically result in semiconductor products that can be produced more cheaply and in greater quantity.

The actual process of packaging and assembling semiconductor products usually involves a series of steps. One such step, such as for packaging flip chips, involves positioning a substrate-type material on a specially designed movable support for receiving a solder, such as solder balls, from a solder depositing member. In operation, once the substrate has been positioned, the solder is then carefully deposited thereon. Conventionally, the substrate is sometimes misaligned or tilted with respect to the solder member, during the deposition of solder balls, which leads to the inaccurate placement of solder, the waste thereof, and decreased yields.

Accordingly, there exists a need for a semiconductor packaging and assembling method and system that stabilizes, with great precision, a substrate material positioned on a moveable fixture with respect to the solder depositing member during the application of the solder balls. This system would advantageously allow for positioning of the substrate, making it less sensitive to tilting and warping as the solder is deposited thereon. Advantageously the system would also maintain the planar alignment of the substrate, with the solder mounted thereon, as it is moved from one stage in packaging and assembly process to another.

SUMMARY OF THE INVENTION

The present invention achieves technical advantages as a system and method capable of allowing solder to be mounted on a substrate with greater precision even if the substrate is slightly misaligned, warped, or tilted. Thus, rather than relying on the planarity of the substrate standing alone as it sits on a retractable support, the invention provides a pivotable substrate support which allows for mounting of the soldering compound to occur by firmly dictating the angle of planarity of the substrate before and after the solder is deposited thereon.

In one embodiment the present invention is a system used to precisely deposit a compound on a substrate, such as solder balls applied to a flip chip. The system generally includes a receiving member having a pivotable portion which comprises a rotating vacuum coupling. The receiving member is adapted to hold a generally planar substrate. The system also includes a horizontal member, comprising a ball mount, for depositing solder balls on the substrate. To fix the planarity of the substrate as the solder ball are deposited thereon, the invention includes a contact member located between the receiving member and the horizontal member to secure the substrate during attachment of the solder balls. The contact member, comprising an aligner plate, has stoppers protruding therefrom, such that the stoppers, together with the rotating action of the vacuum coupling, combine to firmly fix the substrate in a substantially planar position before and after the solder balls are deposited thereon.

In another embodiment, the invention is a method of setting the planarity of a substrate with respect to the solder ball apparatus before and after a solder is deposited thereon. The method generally begins with the act of positioning a substrate on a receiving member which has a rotatable portion, and is then followed by contacting and securing the substrate with a fixed contact member, comprising an aligner plate having protruding stoppers, that establishes the planar alignment of the substrate before and after the solder is deposited thereon.

BRIEF DESCRIPTION OF THE DRAWINGS

Advantages of the invention and the specific embodiments will be understood by those of ordinary skill in the art by reference to the following detailed description of preferred embodiments taken in conjunction with the drawings, in which.

DETAILED DESCRIPTION OF THE PREFERRED EMBODIMENTS

The numerous innovative teachings of the present applications will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others.

Figure 1A:
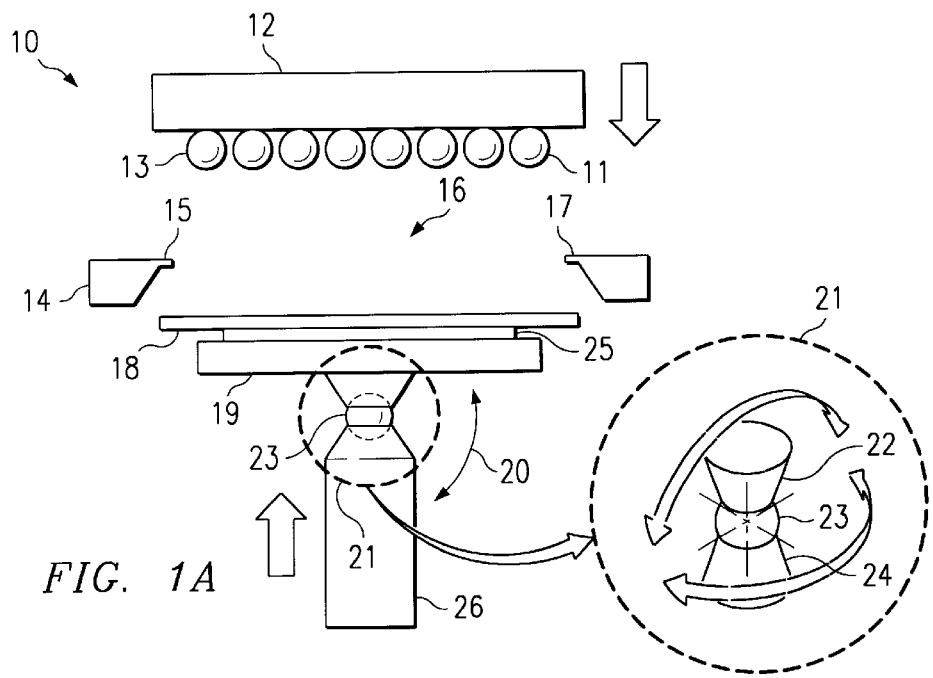
FIGS. 1A, 1B and 1C show a rotating vacuum coupling and an aligner plate establishing the planarity of the substrate in accordance with an exemplary embodiment of present invention.

FIG. 1A shows a semiconductor fabrication system 10 in accordance with an exemplary embodiment of present invention. The system 10 is seen to have a horizontal member 12 opposite a receiving member 20 which has a substrate material 18 mounted thereon. The horizontal member 12 comprises a solder ball mount apparatus, which is seen having a plurality of detachable solder balls 11,13 attached thereto. The solder balls are held in place by a plurality of spaced apart tool heads 44 (not shown) which function to hold and selectively release the solder balls 11,13 above and upon the upper surface of substrate 18 at predetermined locations, as will be discussed shortly in regards to FIG. 3.

The system 10 also includes a receiving member 20 comprising a supporting base 19 and a vertical member 26 rotatably coupled thereto, forming a T-shaped support, and adapted to position and hold the substrate 18 opposite the horizontal member 12 in a planar relationship relative to the solder ball mount apparatus 12. In operation, the vertical member 26 contacts and supports the underside of the base 19 and holds both the base 19, and the substrate 18 thereon, in place through vacuum pressure (i.e., suction) communicated therethrough to prevent the substrate 18 from undesirably shifting across the surface thereof.

In a preferred embodiment, vertical member 26 which comprises a vertical vacuum conduit extended therethrough coupled to a vacuum source (not shown), is seen having a rotatable vacuum coupling 21 including top member 22 and a bottom member 24 portion with a rotating vacuum interface 23 pivotally coupled therebetween. As such, the rotating vacuum interface 23 advantageously allows the base 19 to pivot in varying positions with respect to solder apparatus 12, causing, in turn, the substrate 18 fixed thereon to swivel slightly as base 19 and vertical member 26 each moves, up and down, along a vertical axis proximate attachment space 16 while remaining planar.

Figure 1B:
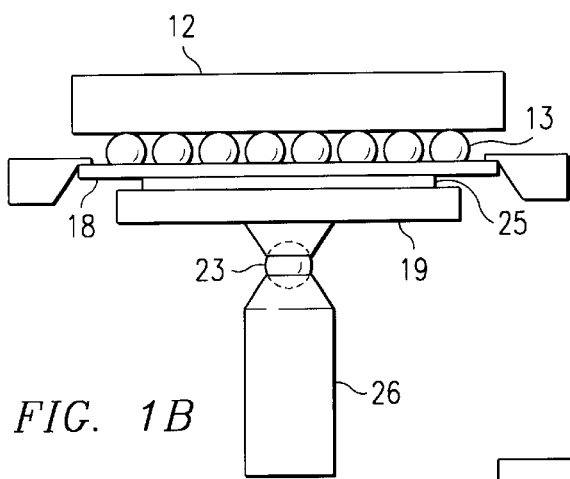

As shown in FIG. 1B, the ball mount 12 and the receiving member 20 converge, and the soldering balls positioned therebetween are deposited on the substrate 18. An aligner plate 14 is shown evenly positioned between the horizontal member 12 and the receiving member 20. Moreover, aligner plate 14 is seen having two protruding portions comprising stoppers 15 and 17 which are adapted to contact and secure with the outer edges of the planar substrate 18 as the base 19 is moved by member 26, upwardly, into a receiving position therewith. Advantageously, the rotating vacuum coupling 23 of the vertical member 26, along with stoppers 15 and 17, establish, with precision, the horizontal planarity of the substrate 18 and with respect to receiving member 20 such that the soldering balls 11,13 may be deposited thereon even if it is misaligned, tilted or warped, prior to or during delivery of the solder balls.

Figure 1C:
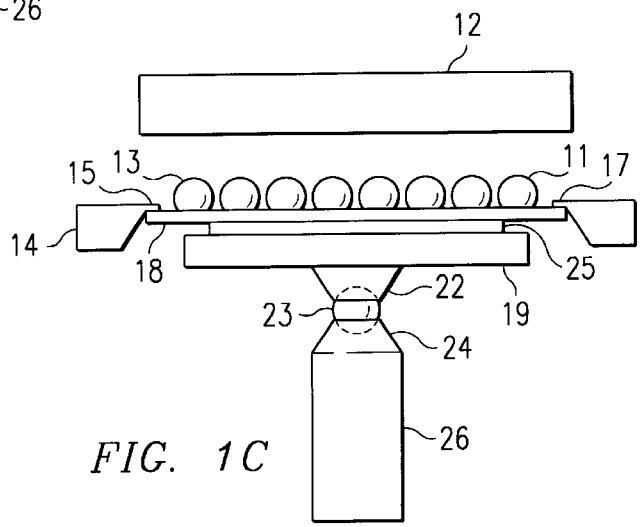

With reference to FIG. 1C, there is shown the substrate 18 having solder balls 11, 13 uniformly positioned thereon and as deposited by horizontal member 12 in accordance with an exemplary embodiment of the present invention. Stoppers 15 and 17 will remain in contact with the substrate 18 after the solder balls 11,13 have been deposited thereon while horizontal member 12 retracts, and until both the base 19 and the vertical member 26 retract, simultaneously, along a vertical axis. Thereafter, the substrate 18 is then repositioned onto a movable tray 48 and advanced for further processing. In addition, it should be understood that the aligner plate 14 may be adjusted so as to accommodate substrate materials of varying lengths, shapes and sizes. Moreover, although the aligner plate 14 is seen having two stoppers protruding therefrom and contacting the outer edges of the generally planar substrate 18, any number of stoppers may be designed into the aligner plate 14 to further stabilize and set the planar alignment of the substrate 18, such as, 4 or 6 stoppers, for example.

Figure 2A:
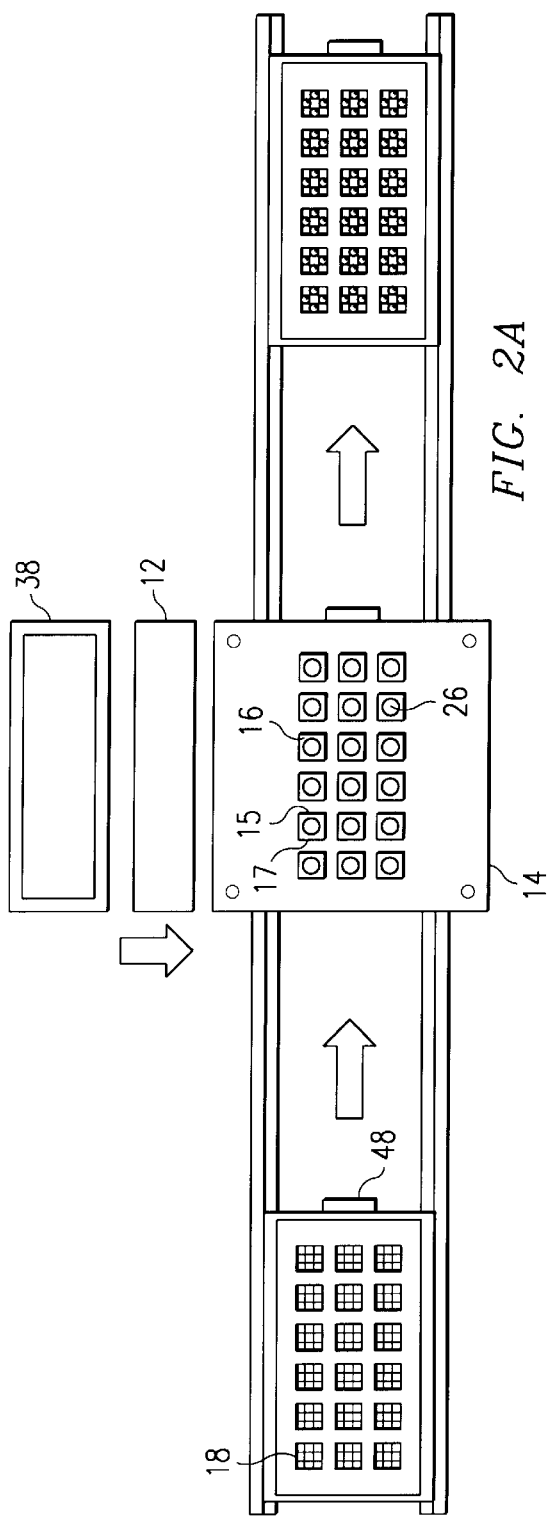
FIGS. 2A and 2B show a top and side view, respectively, of a semiconductor fabrication system in accordance with the present invention.
Figure 2B:
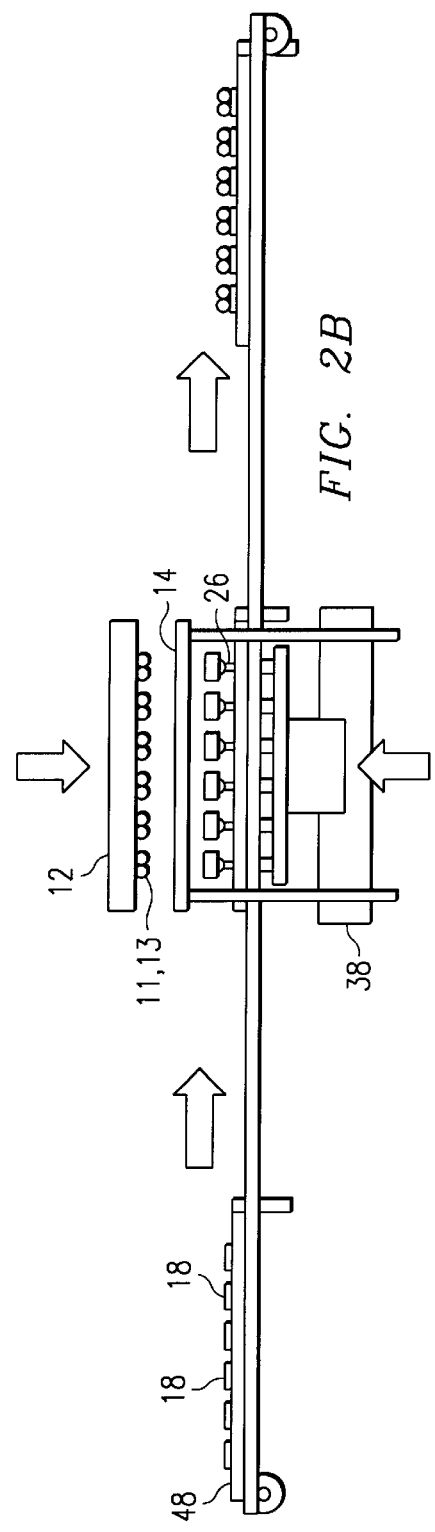

FIGS. 2A and 2B show a top and side view, respectively, of a semiconductor fabrication system. In one preferred embodiment, the aligner plate 14 is seen having a plurality of evenly spaced square-shaped openings 16, each having multiple protruding stoppers 15 and 17. Moreover, each opening is adapted to receive multiple substrate 18 units with respective vacuum apparatus 21 operatively positioned thereunder. The trays carrying the substrates 18 are advanced to the ball attach station for applying the balls as previously described, and then the tray of substrates 18, with the solder balls attached thereto, advanced.

Figure 3:
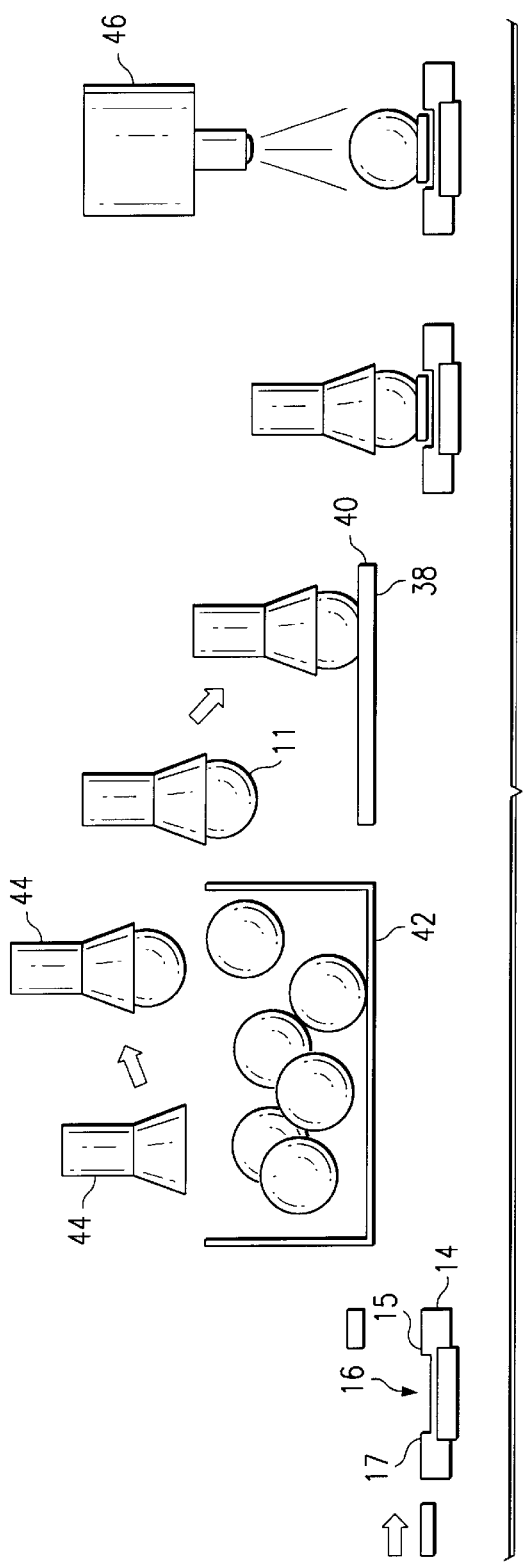
FIG. 3 shows a solder ball attaching and depositing process in accordance with the present invention.

FIG. 3 shows a solder ball attachment and depositing process in accordance with the present invention. In one embodiment, the ball mount holder 12 comprises a plurality of tool heads 44 each adapted to individually collect each solder ball 11,13 from solder bin 42 proximate a flux table 38. In operation, the tool heads 44 generate vacuum pressure, creating a suction force, to hold and remove the solder balls 11,13 from the solder bin 42, whereby the solder balls 11,13 are then moved to a flux table 38 and dipped in a flux compound 40 before being deposited onto the substrate 18. During fabrication, a vision sensor 46 is then used to sense if the solder balls 11,13 have been successfully placed on the substrate 18.

Figure 4:
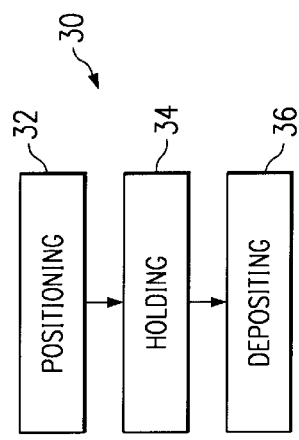
FIG. 4 illustrates a method of horizontally aligning the generally planar substrate using a receiving member having a rotating vacuum coupling and aligner plates having a plurality of stoppers protruding therefrom according to the present invention.

Referring now to FIG. 4, there is illustrated a method of setting the planar alignment of the substrate 18 with respect to the solder ball apparatus 12 as applied in semiconductor fabrication in accordance with the invention. The method, generally denoted as 30, begins with a positioning act 32 which involves positioning the substrate 18 on the movable receiving member 20 comprising the base 19 and the vertical member 26 having the pivotable portion 21. In one embodiment, the pivotable portion 21 rotates the vacuum coupling 23 which is adapted to rotate in a variety of different dimensions, causing, in turn, the base 19, with the substrate 18 couple thereto, to rotate to make substrate 18 planar with respect to horizontal number 12. Moreover, the receiving member 20 is capable of moving linearly along a vertical axis.

Next, the positioning act 32 is followed by a holding act 34 wherein the substrate is elevated by member 26 to engage spaced apart stopper 15 and 17 which contact the outer edges of substrate 18. In one preferred embodiment, the contact member, comprising the aligner plate 14, has two protruding stoppers 15 and 17, respectively. In operation, stoppers 15 and 17 are adapted to lock in the angle of planarity of the substrate 18 when it is elevated to a predetermined position by receiving member 20.

Finally, the holding act 34 is followed by a depositing act 36 wherein the movable horizontal member 12, deposits a solder compound on the substantially planar substrate 18. In one select embodiment, the compound consist of solder balls 11 and 13 which are spaced apart and are linearly configured so as to be deposited uniformly across the surface of the substrate 18. To ensure planar stability of the substrate 18, each stopper will remain in contact with the substrate 18 even after delivery of the solder balls as the member 12 retracts.

Though the invention has been described with respect to specific preferred embodiments, many variations and modifications will become apparent to those skilled in the art upon reading the present application. It is therefore the intention that the appended claims be interpreted as broadly as possible in view of the prior art to include all such variations and modifications.

What is claimed is:

1. A method of depositing a solder onto a substrate, comprising the steps of:

positioning said substrate on a receiving member having a pivotable portion, said pivotable receiving member comprising a portion adapted to act as an air conduit for holding said substrate on said base;

engaging said substrate with a contact member, whereby the pivotable receiving member establishes planarity of said substrate with respect to said contact member; and depositing solder on said substrate.

2. The method of claim 1 wherein said contact member has protruding side portions, said protruding side portions forming stoppers adapted to stop said substrate at a predetermined position with respect to such receiving member.

3. The method of claim 1 wherein contact member comprises an aligner plate opposing said pivotable receiving member.

4. The method of claim 1 wherein said pivoting receiving member comprises:

a base;

a vertical member pivotably coupled to said base and defining a T-shaped support, wherein said vertical member is adapted to act as said air conduit for holding said substrate on said base.

5. The method of claim 1 wherein said pivotable receiving member comprises:

a top portion;

a bottom portion; and a pivotable member coupled between said top and bottom portion, wherein said pivotable portion is rotatable in a plurality of different dimensions.

6. The method of claim 1 wherein said solder ball mount configures a plurality of linearly configured soldering balls.

7. The method of claim 4 wherein said pivoting vertical member is a pivotable vacuum.

8. A method of depositing solder onto a substrate, comprising the steps of:

mounting said substrate on a pivotable vacuum member;

providing an aligner plate;

using said pivotable vacuum member to press said substrate onto said aligner plate; and depositing solder onto said substrate.

9. The method of claim 8, wherein said pivotable vacuum member comprises:

a base;

a vertical member pivotably coupled to said base and defining a T-shaped support, wherein said vertical member is adapted to act as an air conduit for holding said substrate on said base.

10. The method of claim 8, wherein said pivotable vacuum member comprises:

a top portion;

a bottom portion; and a pivotable member coupled between said top and bottom portion, wherein said pivotable portion is rotatable in a plurality of different dimensions.

11. A method of depositing solder onto a substrate, comprising the steps of:

mounting said substrate on a pivotable vacuum member;

providing an aligner plate;

providing a horizontal member aligned with said aligner plate;

mounting solder on said horizontal member;

using said pivotable vacuum member to press said substrate onto said aligner plate;

moving said horizontal member toward said aligner plate until said solder on said horizontal member contacts said substrate.

12. The method of claim 11, wherein said pivotable vacuum member comprises:

a base;

a vertical member pivotably coupled to said base and defining a T-shaped support, wherein said vertical member is adapted to act as an air conduit for holding said substrate on said base.

13. The method of claim 11, wherein said pivotable vacuum member comprises:

a top portion;

a bottom portion; and a pivotable member coupled between said top and bottom portion, wherein said pivotable portion is rotatable in a plurality of different dimensions.

* * * * *